(12) United States Patent
Yoon et al.

(10) Patent No.: US 7,176,058 B2
(45) Date of Patent: *Feb. 13, 2007

(54) CHIP SCALE PACKAGE AND METHOD OF FABRICATING THE SAME

(75) Inventors: Joon Ho Yoon, Seoul (KR); Yong Chil Choi, Suwon (KR); Suk Su Bae, Changwon (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/988,523

(22) Filed: Nov. 16, 2004

(65) Prior Publication Data

US 2005/0087848 A1 Apr. 28, 2005

(51) Int. Cl.
*H01L 21/44* (2006.01)
*H01L 21/48* (2006.01)
*H01L 21/50* (2006.01)

(52) U.S. Cl. .................. 438/110; 438/113; 438/107; 257/E21.506; 257/E21.599

(58) Field of Classification Search ............... 438/102, 438/110, 113
See application file for complete search history.

(56) References Cited

U.S. PATENT DOCUMENTS

| | | |
|---|---|---|
| 5,441,898 A | 8/1995 | Richards et al. |
| 5,994,167 A | 11/1999 | Tai et al. |
| 6,177,719 B1 * | 1/2001 | Huang et al. ............ 257/666 |
| 6,187,615 B1 | 2/2001 | Kim et al. |

FOREIGN PATENT DOCUMENTS

| | | |
|---|---|---|
| CN | 1246731 | 3/2000 |
| EP | 1 085 561 | 3/2001 |
| EP | 1085561 | * 3/2001 |
| JP | 11-111742 | 4/1999 |
| JP | 11-243231 | 9/1999 |

* cited by examiner

*Primary Examiner*—David A. Zarneke
(74) *Attorney, Agent, or Firm*—Lowe Hauptman & Berner, LLP.

(57) ABSTRACT

Disclosed are a chip scale package and a method of fabricating the chip scale package. The chip scale package comprises conductive layers with a designated depth formed on an upper and a lower surfaces of a chip, and electrode surfaces formed on the same side surfaces of the conductive layers, which are connected to corresponding connection pads of a printed circuit board. The chip scale package is miniaturized in the whole package size. Further, the method of fabricating the chip scale package does not require a wire-bonding step or a via hole forming step, thereby simplifying the fabrication process of the chip scale package and improving the reliability of the chip scale package.

9 Claims, 6 Drawing Sheets

PRIOR ART

FIG. 1

PRIOR ART

CHIP SCALE PACKAGE AND METHOD OF FABRICATING THE SAME

BACKGROUND OF THE INVENTION

1. Field of the Invention

The present invention relates to a chip scale package, and more particularly to a chip scale package which is miniaturized and more easily fabricated by forming conductive layers on both surfaces of a chip and by forming electrode surfaces on side surfaces of the conductive layers, and a method of fabricating the chip scale package.

2. Description of the Related Art

Generally, semiconductor devices such as diodes are packaged and these packaged devices are then mounted on a printed circuit board. Structurally, this package easily connects terminals of the semiconductor device to corresponding signal patterns of the printed circuit board and serves to protect the semiconductor device from external stresses, thereby improving reliability of the package.

In order to satisfy recent trends of miniaturization of semiconductor products, the semiconductor chip packages also have been miniaturized. Therefore, a chip scale package (also, referred to as a "Chip Size Package") has been introduced.

Figure 1:
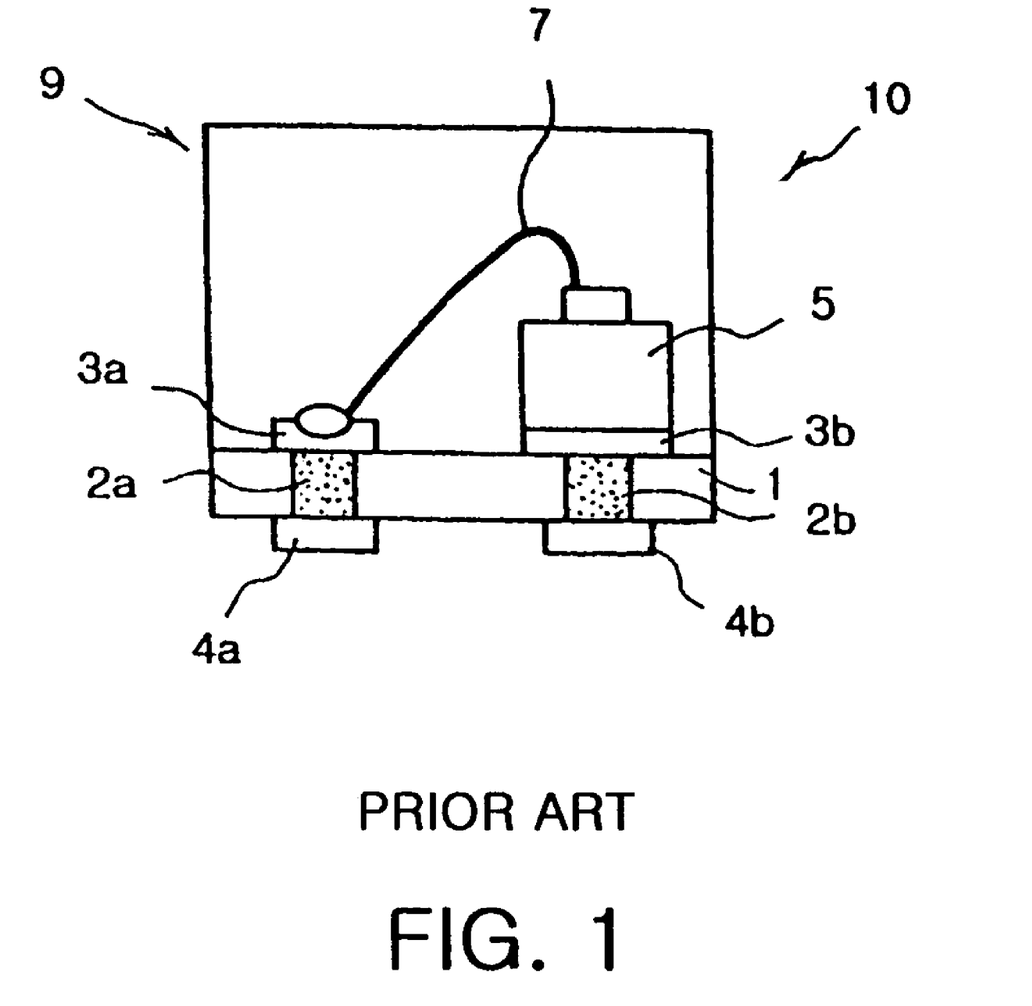
FIG. 1 is schematic cross-sectional view of a conventional chip scale package.

FIG. 1 is a schematic cross-sectional view of a conventional chip scale package. The structure of the chip scale package 10 of FIG. 1 employs a ceramic substrate 1 and is a diode package with two terminals.

With reference to FIG. 1, two via holes, i.e., a first via hole 2a and a second via hole 2b, are formed on the ceramic substrate 1. The first and the second via holes 2a and 2b are filled with a conductive material so as to electrically connect the upper surface of the substrate 1 to the lower surface of the substrate 1. Then, a first and a second upper conductive lands 3a and 3b are formed on the upper surfaces of the first and the second via holes 2a and 2b, respectively. A first and a second lower conductive lands 4a and 4b are formed on the lower surfaces of the first and the second via holes 2a and 2b, respectively. The second upper conductive land 3b is directly connected to a terminal formed on the lower surface of the diode 5, i.e., a mounting surface of the diode 5 on a printed circuit board, and the first upper conductive land 3a is connected to the other terminal formed on the upper surface of the diode 5 by a wire 7. A molding part 9 using a conventional resin is formed on the upper surface of the ceramic substrate 1 including the diode 5 in order to protect the diode 5 from the external stresses. Thereby, the manufacture of the package 10 is completed.

Figure 2:
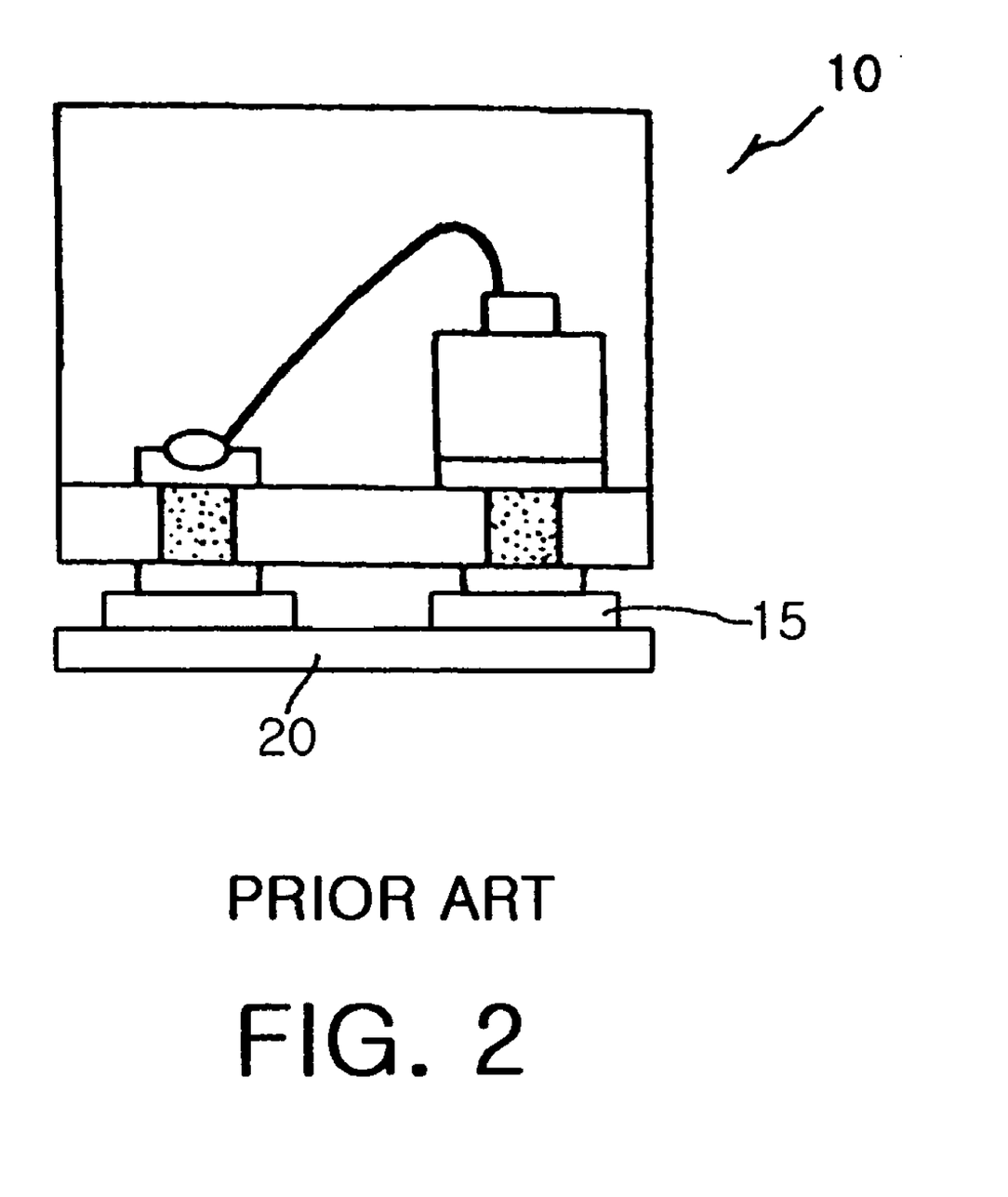
FIG. 2 is a cross-sectional view of a conventional chip scale package assembly, in which the chip scale package is mounted on a printed circuit board.

FIG. 2 is a cross-sectional view of a conventional chip scale package assembly, in which the chip scale package is mounted on the printed circuit board.

As shown in FIG. 2, the manufactured diode package 10 is mounted on the printed circuit board 20 by a reflow soldering. That is, the diode package 10 is mounted on the printed circuit board 20 by arranging the lower conductive lands 4a and 4b of the package 10 on the corresponding signal patterns of the printed circuit board 20 and by then connecting the lower conductive lands 4a and 4b to the signal patterns of the printed circuit board 20 with a solder 15.

As shown in FIGS. 1 and 2, since the diode usually has a terminal on each of its two opposite surfaces, these terminals must be interconnected by wires. However, these wires require a large space on the upper surface of the chip, thereby increasing the overall height of the package. Further, since at least two via holes, corresponding to the number of terminals of the diode, must be formed on the ceramic substrate, an area as large as the total diameters of the via holes is further required. Moreover, in order not to connect the conductive lands formed on the upper and the lower surfaces of the via holes to each other, the conductive lands must be spaced from each other by a minimum interval. Therefore, the substrate has a large size so as to satisfy the aforementioned conditions, and the size of the substrate imposes a limit in miniaturizing the package.

Further, the ceramic substrate which is employed by the above-described package is high-priced, thereby increasing the production cost of the package. Moreover, the conventional fabrication process of the package requires a wire-bonding step and a molding step as well as a die-bonding step, thereby being very complicated.

Accordingly, a packaging technique, which can minimize the size of the package and simplify its fabricating process, has been demanded.

SUMMARY OF THE INVENTION

Therefore, the present invention has been made in view of the above problems, and it is an object of the present invention to provide a chip scale package, which is miniaturized and more simply fabricated, by forming conductive layers on an upper and a lower surfaces of a chip with terminals and by forming electrode surfaces on side surfaces of the conductive layers, thereby improving the reliability of the package.

It is another object of the present invention to provide a chip package assembly with an innovative mounting method according to the structure of the chip scale package.

It is a yet another object of the present invention to provide a method of fabricating the chip scale package.

In accordance with one aspect of the present invention, the above and other objects can be accomplished by the provision of a chip scale package comprising a chip having a first surface provided with a first terminal and a second surface provided with a second terminal, the second surface being opposite to the first surface, a first and a second conductive layers formed on the first and the second surfaces of the chip, respectively, and electrode surfaces, each formed on side surfaces of the first and the second conductive layers.

In accordance with another aspect of the present invention, there is provided a chip scale package assembly comprising a chip scale package and a printed circuit board. The chip scale package comprises a chip having a first surface provided with a first terminal and a second surface provided with a second terminal, the second surface being opposite to the first surface, a first and a second conductive layers formed on the first and the second surface of the chip, respectively, and electrode surfaces, each formed on side surfaces of the first and the second conductive layers. The printed circuit board comprises connection pads for being connected to the electrode surfaces of the chip scale package, and circuit patterns connected to the connection pads.

In accordance with yet another aspect of the present invention, there is provided a method of fabricating a chip scale package, comprising the steps of (i) preparing a wafer including a plurality of chips, the chip including a terminal on its upper and its lower surfaces, respectively, (ii) forming conductive layers, each formed on the upper and the lower surfaces of the wafer, and (iii) dicing the wafer into package units, each package unit including a chip, and forming electrode surfaces, each formed on side surfaces of two conductive layers.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 3:
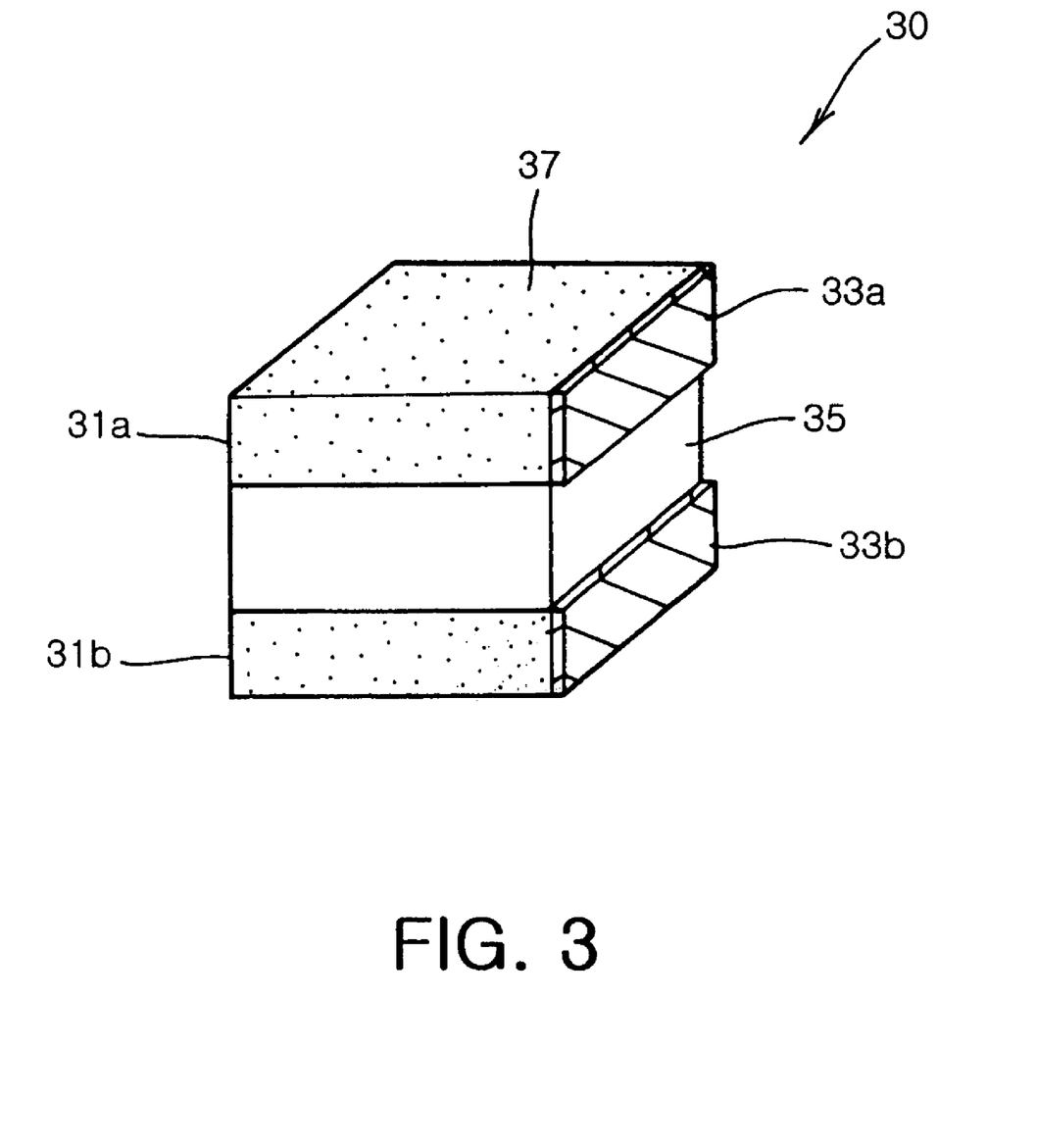
FIG. 3 is a perspective view of a chip scale package in accordance with a preferred embodiment of the present invention.

FIG. 3 is a perspective view of a chip scale package in accordance with a preferred embodiment of the present invention.

With reference to FIG. 3, a chip scale package 30 comprises a chip 35, an upper conductive layer 31a formed on the upper surface of the chip 35, a lower conductive layer 31b formed on the lower surface of the chip 35, a first electrode surface 33a formed on one side surface of the upper conductive layer 31a, and a second electrode surface 33b formed on one side surface of the lower conductive layer 31b. Herein, the side surface of the upper conductive layer 31a having the first electrode surface 33a and the side surface of the lower conductive layer 31b having the second electrode surface 33b are on the same side surface of the conductive layers 31a and 31b. The chip 35 includes an upper terminal (not shown) formed on the upper surface and a lower terminal (not shown) formed on the lower surface. For example, the chip 35 is a diode.

The upper conductive layer 31a formed on the upper surface of the chip 35 is connected to the upper terminal (not shown), and the lower conductive layer 31b formed on the lower surface of the chip 35 is connected to the lower terminal (not shown). The upper and the lower conductive layers 31a and 31b may be a metal layer made of copper (Cu), but is not limited thereto. The upper and the lower conductive layers 31a and 31b must have a designated depth according to an interval between connection pads formed on a printed circuit board. That is, since the electrode surfaces 33a and 33b formed on the side surfaces of the upper and the lower conductive layers 31a and 31b are located on the corresponding connection pads of the printed circuit board, the upper and the lower conductive layers 31a and 31b require a sufficient thickness.

The upper and the lower conductive layers 31a and 31b can be formed at a predetermined depth by a conventional plating process. However, the formation of the upper and the lower conductive layers 31a and 31b using the plating process requires a long time and incurs a higher production cost. Therefore, preferably, a plating layer is first formed by electroplating. Then at least one copper layer is stacked on the plating layer, thereby easily forming the conductive layers with the desired depth.

Further, the first electrode surface 33a is formed on one side surface of the upper conductive layer 31a, and the second electrode surface 33b is formed on one side surface of the lower conductive layer 31b. The side surface of the upper conductive layer 31a having the first electrode surface 33a and the side surface of the lower conductive layer 31b having the second electrode surface 33b are on the same side surface of the upper and the lower conductive layer 31a and 31b. The first and the second electrode surfaces 33a and 33b are electrically and mechanically connected to the corresponding connection pads of the printed circuit board. Therefore, preferably, the first and the second electrode surfaces 33a and 33b are metal layers including gold (Au) so as to subsequently perform the soldering.

In the aforementioned chip scale package 30, the upper and the lower terminals (not shown) formed on the upper and the lower surfaces of the chip 35 are connected to the first and the second electrode surfaces 33a and 33b through the upper and the lower conductive layers 31a and 31b, respectively. Therefore, the side surfaces having the first and the second electrode surfaces 33a and 33b are mounting surfaces on the printed circuit board. That is, the chip scale package 30 of FIG. 3 is turned at an angle of 90 degrees, and the turned chip scale package 30 is then mounted on the printed circuit board so that the first and the second electrode surfaces 33a ad 33b are connected to the corresponding connection pads of the printed circuit board.

In order to prevent the upper and the lower conductive layers 31a and 31b, which are exposed to the outside, from oxidizing, a passivation layer 37 may be formed on the upper and the lower conductive layers 31a and 31b except for the first and the second electrode surfaces 33a and 33b. Preferably, the passivation layer 37 is an insulation film formed by coating an insulating resin. If necessary, the passivation layer 37 may be further formed on the exposed side surfaces of the chip 35.

Figure 4:
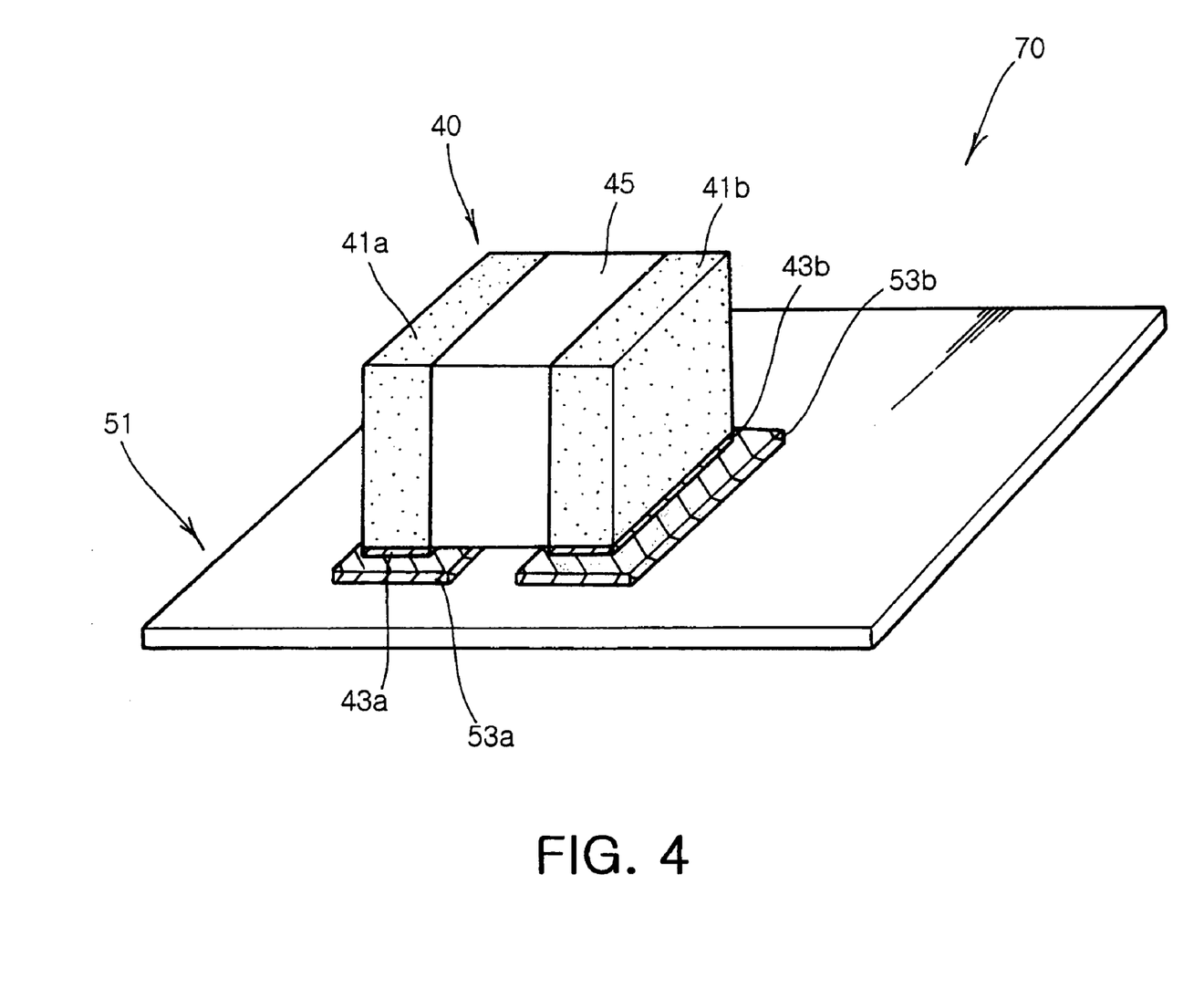
FIG. 4 is a perspective view of a chip scale package assembly, in which a chip scale package is mounted on a printed circuit board in accordance with the preferred embodiment of the present invention.

FIG. 4 is a perspective view of a chip scale package assembly 70, in which a chip scale package 40 is mounted on a printed circuit board 51 in accordance with the preferred embodiment of the present invention.

As shown in FIG. 4, the chip package assembly 70 comprises the chip scale package 40 and the printed circuit board 51 for mounting the chip scale package 40. The chip scale package 40 comprises a chip 45, an upper conductive layer 41a formed on the upper surface of the chip 45, a lower conductive layer 41b formed on the lower surface of the chip 45, a first electrode surface 43a formed on one side surface of the upper conductive layer 41a, and a second electrode surface 43b formed on one side surface of the lower conductive layer 41b. Herein, the side surface of the upper conductive layer 41a having the first electrode surface 43a and the side surface of the lower conductive layer 41b having the second electrode surface 43b are on the same side surfaces of the upper and the lower conductive layers 41a and 41b. The first and the second electrode surfaces 43a and 43b are mounting surfaces of the chip scale package 40 on the printed circuit board 51. The first and the second electrode surfaces 43a and 43b are connected to the upper and the lower terminals (not shown) of the chip 45 through the upper and the lower conductive layers 41a and 41b, respectively. The chip scale package 40 is mounted on the printed circuit board 51 by disposing the first and the second electrode surfaces 43a and 43b of the chip scale package 40 on corresponding connection pads 53a and 53b of the printed circuit board 51 and by performing the soldering between the first and the second electrode surfaces 43a and 43b and the connection pads 53a and 53b, thereby completing the fabrication of the chip package assembly 70 of FIG. 4.

Designated circuits (not shown) formed on the printed circuit board 51 are connected to each terminal of the chip 45 via the first and the second electrode surfaces 43a and 43b of the chip scale package 40 connected to the connection pads 53a and 53b. As described above, the first and the second conductive layers 41a and 41b have a designated depth according to the interval between the connection pads 53a and 53b of the printed circuit board 51.

Further, the present invention provides a method of fabricating the chip scale package. FIGS. 5a through 5f are cross-sectional views illustrating each step of the method of fabricating the chip scale package in accordance with the preferred embodiment of the present invention.

Figure 5A:
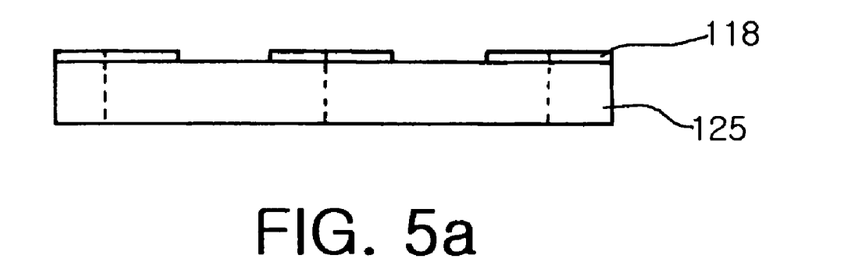
FIGS. 5a through 5f are cross-sectional views illustrating each step of a method of fabricating the chip scale package in accordance with a preferred embodiment of the present invention.

First, as shown in FIG. 5a, a wafer 125 including a plurality of chips is prepared. A terminal is formed on the upper and the lower surfaces of each chip. Herein, each chip is divided by a dotted line of the upper surface of the wafer 125. FIG. 5a shows a partial cross-section of the wafer 125. However, the whole structure of the wafer 125 with a plurality of the chips will be apparent to those skilled in the art.

The chip comprises an upper and a lower terminals 101a and 101b on its upper and lower surfaces, respectively. Further, a mask pattern 118 with a plurality of windows is formed on the wafer 125, thereby exposing terminal areas of the wafer 125. The windows of the mask pattern 118 correspond to the terminal areas of the wafer 125.

Figure 5B:
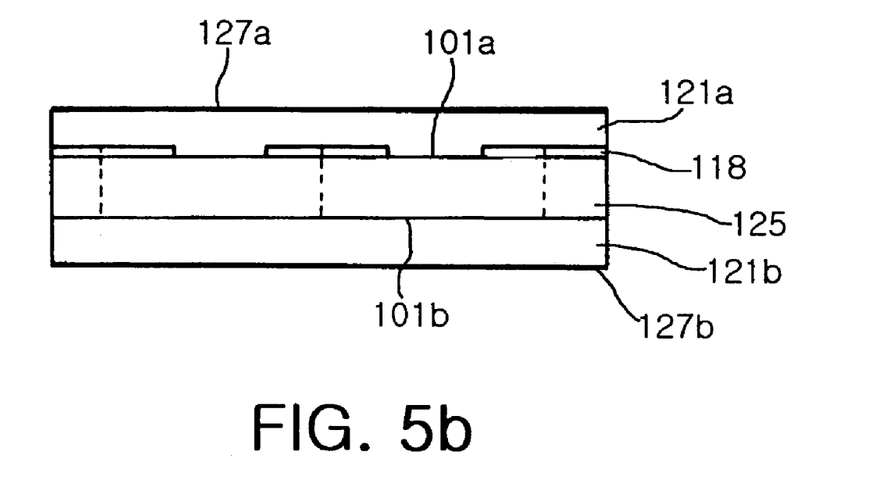

As shown in FIG. 5b, upper and lower conductive layers 121a and 121b are formed on the upper and the lower surfaces of the wafer 125, respectively. Then, passivation layers 127a and 127b are formed on the first and the lower conductive layers 121a and 121b, respectively.

The upper and the lower conductive layers 121a and 121b are connected to the upper and the lower terminals 101a and 101b, respectively. The upper and the lower conductive layers 121a and 121b may be formed by the plating step. However, preferably, the upper and the lower conductive layers 121a and 121b are formed by forming a plating layer and then by stacking at least one copper layer on the plating layer, thereby having a depth corresponding to the interval between the connection pads of the printed circuit board.

The passivation layers 127a and 127b prevent the upper and the lower conductive layers 121a and 121b from oxidizing, thereby improving the reliability of the package. Preferably, the upper and the lower conductive layers 121a and 121b are insulation layers formed by coating an insulation resin. In case the wafer 125 can be sufficiently protected from the external stresses only using the naturally formed oxidation layer according to the usage condition of the chip scale package, the passivation layers 127a and 127b may be omitted. Further, the step of forming the passivation layers 127a and 127b may be variously applied. That is, as shown in FIG. 5f, which will be described later, after a dicing step, the passivation may be collectively formed on the upper, the lower, and the side surfaces of the conductive layers. However, considering on the oxidation of the conductive layers or an attachment of one surface of the wafer to a tape during the dicing step, the passivation layers 127a and 127b are preferably formed at this step.

Figure 5C:
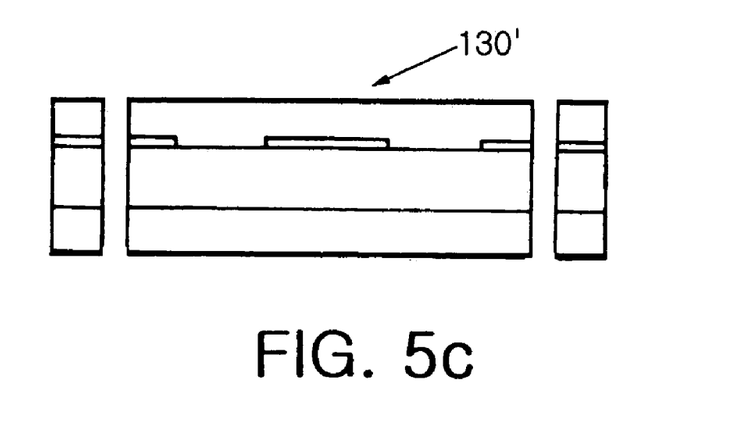

As shown in FIG. 5c, the wafer is first-diced so as to form one side surface of the chip scale package. Preferably, the wafer is diced along the scribe lines into two rows. In the first-diced wafer 130' including two chip scale packages, only one side surface of each chip scale package is exposed to the outside.

Figures 5D, 5E:
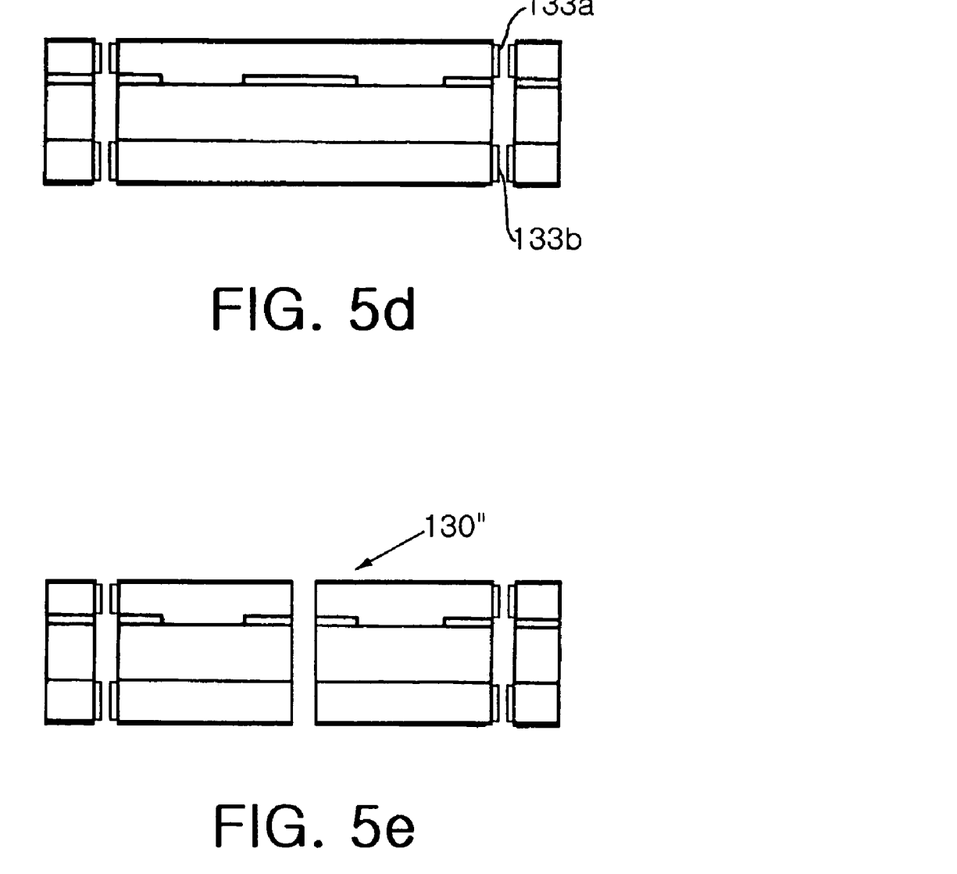
Figure 5F:
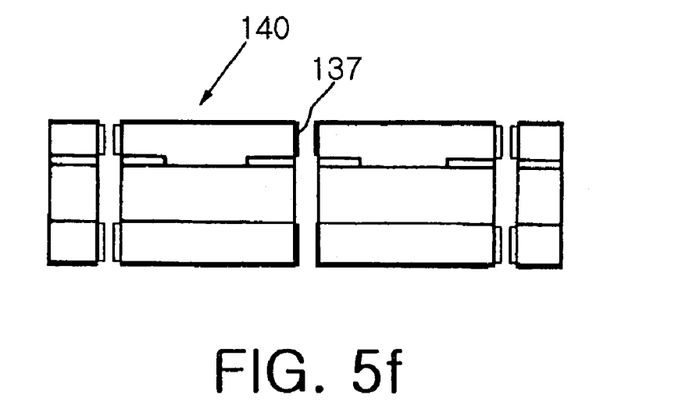

As shown in FIG. 5d, first and second electrode layers 133a and 133b are formed on the side surfaces of the upper and the lower conductive layers 121a and 121b of the diced wafer 130', respectively. The first and the second electrode surfaces 133a and 133b are connected to each terminal of the chip through the first and the second conductive layers 121a and 121b. The first and the second electrode surfaces 133a and 133b are formed by the plating process using gold (Au). Thereby, the electrode surface is not formed on the side surfaces of the chip made of silicon and the passivation layer made of insulating resin, but is formed on the side surfaces of the first and the second conductive layers 121a and 121b made of metal. That is, the first and the second electrode surfaces 133a and 133b are selectively formed on the wafer.

After forming the first and the second electrode surfaces 133a and 133b, as shown in FIG. 5e, the first-diced wafer 130' is then second-diced, thereby forming a plurality of chip scale package units 130". Then, as shown in FIG. 5f, a passivation layer 137 is formed on the side surfaces of the first and the second conductive layers 121a and 121b, thereby completing the fabrication of a chip scale package 140, as shown in FIG. 3. The passivation layer 137 shown in FIG. 5f is formed in the same manner as the passivation layers 127a and 127b shown in FIG. 5b. That is, the passivation layer 137 shown in FIG. 5f is also formed by coating insulating rein.

The method of fabricating the chip scale package shown in FIGS. 5a through 5f is a preferred embodiment of the present invention. Therefore, the method of fabricating the chip scale package may be variously modified within the scope and spirit of the present invention. Particularly, the steps shown in FIGS. 5c through 5f can be widely modified according to the dicing steps. That is, after first-dicing the wafer so that side surfaces other than a designated side surface of the chip scale package are formed, a passivation layer is formed on side surfaces of conductive layers forming the side surface obtained by the first-dicing step, respectively. Then, the first-diced wafer is second-diced, thereby forming chip scale package units. An electrode surface is formed on the side surfaces the conductive layers forming the side surface obtained by the second-dicing step, respectively. However, as described above, the wafer is attached and fixed to the tape prior to the dicing step. In this case, as larger sized wafer is attached to the tape, the fabrication process is more stably performed. Therefore, preferably, a large area of the first-diced wafer is fixed to the tape. Therefore, the aforementioned steps shown in FIGS. 5c to 5f are preferable.

In accordance with the method of fabricating the chip scale package of the present invention, the wafer is diced into a plurality of chip scale packages having one chip, and the electrode surfaces are formed on the side surfaces of two conductive layers of one side surface of the chip scale package and the passivation layers are formed on other side surfaces of the conductive layers. Therefore, each dicing step for forming the side surfaces of the chip scale package and the steps for forming the passivation layers and the electrode surfaces may be variously modified in order and manner. These modifications or improvements are within the scope and spirit of the present invention.

As apparent from the above description, the present invention provides a chip scale package, which is miniaturized and more easily fabricated, by forming conductive layers on upper and lower surfaces of a chip, each having a terminal and by forming electrode surfaces on the same sides surface of the conductive layers, thereby improving the reliability of the package. Further, the present invention provides a method for fabricating the chip scale package, in which the conventional wire bonding step or via hole forming step are omitted, thereby simplifying the fabrication process and reducing the fabrication cost.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a chip scale package, said method comprising the steps of:
    (i) preparing a wafer including a plurality of chips, said chip including a terminal on each of its upper and its lower surfaces, respectively;
    (ii) forming conductive layers, each formed on the upper and the lower surfaces of the wafer; and
    (iii) dicing the wafer into package units, each package unit including a clip, followed by forming electrode surfaces formed each of designated side surfaces of the conductive layers,
    wherein after the step (ii), further comprising the step of forming passivation layers, each formed on the first and the second conductive layers except for the side surfaces having the electrode surfaces, wherein the step (iii) comprises the sub-steps of:
        first-dicing the wafer so that one side surface of the chip scale package is formed; forming electrode surfaces on side surfaces of the first and the second conductive layers, said side surfaces formed on the side surface of the chip scale package obtained by first-dicing the wafer;
        second-dicing the wafer into package units; and forming passivation layers on side surfaces of the first and the second conductive layers, said side surfaces formed on the side surface of the chip scale package obtained by second-dicing the wafer, and
    wherein the step of first-dicing the wafer is the step of dicing the wafer so that scribe lines of the wafer are cut into two rows.

2. The method of fabricating the chip scale package as set forth in claim 1, wherein the step (iii) further comprises the step of forming passivation layers, each formed on the exposed surfaces of the first and the second conductive layers except for the side surfaces having the electrode surfaces.

3. The method of fabricating the chip scale package as set forth in claim 1, wherein said passivation layers are made of insulating films formed by coating insulation resin.

4. The method of fabricating the chip scale package as set forth in claim 1, wherein the conductive layers are formed by a plating method.

5. The method of fabricating the chip scale package as set forth in claim 1, wherein the conductive layers are metal layers including copper (Cu).

6. The method of fabricating the chip scale package as set forth in claim 1, wherein the electrode surfaces are metal layers including gold (Au).

7. The method of fabricating the chip scale package as set forth in claim 1, wherein the conductive layers are formed by forming metal layers by a plating method and by stacking at least one copper layer on each metal layer.

8. The method of fabricating the chip scale package as set forth in claim 1, wherein the electrode surfaces are formed by a plating method.

9. The method of fabricating the chip scale package as set forth in claim 1, wherein the chip is a diode.

* * * * *